(12) United States Patent
Uchida et al.

(10) Patent No.: US 7,791,425 B2  
(45) Date of Patent: Sep. 7, 2010

(54) TWO-LEVEL MOUNTING BOARD AND CRYSTAL OSCILLATOR USING THE SAME

(75) Inventors: Takeshi Uchida, Saitama (JP); Manabu Ito, Saitama (JP); Tomotaka Kuroda, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 85 days.

(21) Appl. No.: 11/975,753

(22) Filed: Oct. 22, 2007

(65) Prior Publication Data
US 2008/0284535 A1 Nov. 20, 2008

(30) Foreign Application Priority Data
Oct. 31, 2006 (JP) ............................. 2006-296914

(51) Int. Cl.
*H03B 1/00* (2006.01)
*H03B 5/32* (2006.01)

(52) U.S. Cl. ...................................... 331/158; 228/126

(58) Field of Classification Search ................. 331/158, 331/68, 69, 176; 228/21, 126, 131, 132, 228/134, 178, 179.1, 180.1, 4.5; 438/26, 438/55, 64, 121; 174/261, 263
See application file for complete search history.

(56) References Cited

U.S. PATENT DOCUMENTS

| | | | | |
|---|---|---|---|---|
| 4,787,853 A * | 11/1988 | Igarashi | ........................ | 439/55 |
| 4,851,614 A * | 7/1989 | Duncan, Jr. | .................. | 174/263 |
| 5,010,448 A * | 4/1991 | Kobari | ........................ | 361/767 |
| 5,189,261 A * | 2/1993 | Alexander et al. | ........... | 174/263 |
| 6,471,109 B2 * | 10/2002 | Muramatsu et al. | ............ | 228/45 |
| 2005/0258913 A1 * | 11/2005 | Ito et al. | ...................... | 331/158 |

* cited by examiner

*Primary Examiner*—Robert Pascal
*Assistant Examiner*—Ryan Johnson
(74) *Attorney, Agent, or Firm*—Scott D. Wofsy; Edwards Angell Palmer & Dodge LLP

(57) ABSTRACT

The present invention relates to a two-level mounting board in which a second substrate is supported horizontally by a metal pin above a first substrate having a mounting electrode on an outer base surface, the free, lower end of the metal pin is inserted in a hole provided in the surface of the first substrate, and the metal pin is affixed by solder to an annular electrode land provided on the surface of the first substrate to form an outer periphery of the hole, wherein part of the ring of the annular electrode land is cut away to open the same. This provides a two-level mounting board in which metal pins can be connected reliably to the first substrate to support the second substrate horizontally, and a crystal oscillator using the same.

3 Claims, 3 Drawing Sheets

TWO-LEVEL MOUNTING BOARD AND CRYSTAL OSCILLATOR USING THE SAME

FIELD OF THE INVENTION

The present invention relates to a two-level mounting board in which one mounting board is supported by using metal pins, together with a crystal oscillator using the same, and, in particular, to a structure by which a metal pin is erected therein.

BACKGROUND OF THE INVENTION

Crystal oscillators are widely used in communications equipment or the like, as frequency reference sources. One type is a constant-temperature type of crystal oscillator (hereinafter abbreviated to "constant-temperature oscillator") for installation into communications equipment such as ground stations or relay stations, in which a crystal vibrator is housed within a constant-temperature oven to keep the operating temperature thereof constant, whereby the resonant frequency thereof is maintained to be highly stable.

DESCRIPTION OF RELATED ART

A prior-art of a constant-temperature oscillator is shown in FIGS. 2 and 3, where FIG. 2A is a longitudinal section through the constant-temperature oscillator and FIG. 2B is a lateral section through a constant-temperature oven 9 shown in FIG. 2A. FIG. 3A is a partial enlarged plan view of a first substrate 1a, FIG. 3B is a partial enlarged section through a portion of the first substrate 1a on which a metal pin 4 is erected, and FIG. 3C is a side view thereof.

This constant-temperature oscillator has a first substrate 1a and a second substrate 1b, as shown in FIG. 2A, both made of a glass epoxy resin material. The first substrate 1a is a stacked substrate formed of three layers, by way of example, which has mounting terminals 2 on four corner portions of an outer base surface thereof, via through-holes in the stacked surface and edge surfaces thereof. Components such as circuit elements 3 are disposed on the surface of the first substrate 1a. The second substrate 1b is supported horizontally above the first substrate 1a by metal pins provided at four corner portions.

In this case, a hole 5 having a bottom is provided in each of the four corner portions of the first substrate 1a, as shown in FIG. 3B, and an annular electrode land 6 is provided in the surface of the first substrate 1a around the outer periphery of the hole 5. Note that no electrode is formed within the hole 5; instead, a conductive circuit (not shown in the figures) is connected to the electrode land 6. The free end of the metal pin 4 on the lower side thereof is inserted into the corresponding hole 5, and the metal pin 4 is connected to the electrode land 6 by solder 7. The bottomed hole 5 is provided by means such as drilling, either as a through-hole provided in the upper layer of the stack or as a bottomed hole after the substrate stack has been assembled, by way of example.

The second substrate 1b is locked onto and supported by a stopper 8 that protrudes in a disk shape at the upper end of each metal pin 4. A crystal vibrator 10 housed in a constant-temperature oven 9 (metal pipe) is disposed on the lower surface of the second substrate 1b, and circuit elements 3a that form the oscillation circuit and another circuit element 3 that controls the temperature of the constant-temperature oven 9 are formed between that lower surface and the constant-temperature oven 9.

The constant-temperature oven 9 has a housing portion for the crystal vibrator 10 that opens to one side, and opposing leg walls 9a thereof form a concave portion 9b with two open ends on a lower surface thereof. Chip resistors 3a that act as heating elements and a thermistor 3b that acts as a temperature detection element are disposed on the second substrate 1b within the concave portion between the leg walls 9a. Reference number 10a denotes a pair of lead wires connected to the crystal vibrator 10.

Each circuit element 3 disposed on the first substrate 1a is electrically connected by a circuit pattern (conductive circuit) that is not shown in the figures, and these are also connected to a circuit pattern on the second substrate 1b by the metal pins 4. In addition, the connections extend from the stacked surface via through-holes to the circuit elements 3 of the second substrate 1b, and are further connected to the previously mentioned mounting terminals 2. Note that a metal film for grounding (shielding) is formed over all the surfaces of the first substrate 1a, with the necessary electrode pattern being formed therein by etching.

In the thus-configured constant-temperature oscillator, the crystal vibrator 10 housed in the constant-temperature oven 9 is disposed on the lower surface of the second substrate 1b, and the second substrate 1b is supported above the first substrate 1a by a plurality of metal pins 4. In such a case, the constant-temperature oven 9 (with the crystal vibrator 10 housed therein) is disposed at a distance above the first substrate 1a, so that the constant-temperature oven 9 is isolated thermally therefrom, preventing thermal radiation. Note that if the circuit elements 3 on the first substrate 1a could be disposed on the second substrate 1b, there would be no need to dispose circuit elements on the first substrate 1a.

PROBLEMS WITH THE PRIOR ART

With the above-configured constant-temperature oscillator of the prior art, however, the lower free ends of the metal pins 4 that support the second substrate 1b are inserted into the holes 5 in the first substrate 1a and are connected by the solder 7 to the electrode lands 6 on the first substrate 1a. For that reason, air trapped within the holes 5 of the first substrate 1a can expand due to heat generated during the soldering and heat imparted thereto by solder reflow when the constant-temperature oscillator is mounted into a set substrate (not shown in the figures), which could rupture the solder 7. This causes problems in that the metal pins 4 cannot be implanted accurately with respect to the first substrate 1a and the joint strength of the metal pins 4 deteriorates.

Note that making the holes 5 in the first substrate 1a as through-holes would solve the problem of air being sealed therein. However, this configuration cannot be used in practice because, if a circuit pattern is formed on the set substrate on which the constant-temperature oscillator is mounted, there would be a danger of electrical contact between the metal pins 4 in the holes 5 and that circuit pattern.

OBJECTIVE OF THE INVENTION

An objective of the present invention is to provide a two-level mounting board in which metal pins are connected reliably by solder to the first substrate thereof, and a crystal oscillator using the same.

SUMMARY OF THE INVENTION

The present invention relates to a two-level mounting board in which a second substrate is supported horizontally by a metal pin above a first substrate having a mounting electrode on an outer base surface, the free, lower end of the metal pin is inserted in a hole provided in the surface of the first substrate, and the metal pin is affixed by solder to an annular electrode land provided on the surface of the first substrate to form an outer periphery of the hole, wherein part of the ring of the annular electrode land is cut away to open the same.

EFFECTS OF THE INVENTION

Since this configuration ensures that part of the electrode land is cut away to open it, a connective portion is formed between the hole and the outer atmosphere, without solder adhering within that cutaway portion. Consequently, if any air expands within the hole due to heat generated during the soldering of the component or by solder reflow when the component is mounted on a set substrate, that air is vented from the connective portion into the outer atmosphere. This enables a reliable connection of each metal pin onto the first substrate, with no breaks in the connective soldering.

The present invention also states that the second substrate is positioned on a stopper that protrudes as a disk provided at the upper end of the metal pin. This ensures that the second substrate is positioned reliably on the metal pin, ensuring a horizontal orientation with respect to the first substrate.

The present invention also relates to a crystal oscillator in which a crystal vibrator housed in a constant-temperature oven is provided on a lower surface of the second substrate, and also a circuit element is disposed on an upper surface of the second substrate. This makes it possible to provide a constant-temperature oscillator in which the operating temperature of the crystal vibrator is constant.

BRIEF DESCRIPTION OF THE DRAWINGS

FIG. 1 is illustrative of an embodiment of a two-level mounting board in accordance with the present invention, where

FIG. 2 is illustrative of a prior-art of a constant-temperature oscillator, where FIG. 3 shows a two-level mounting board that is illustrative of the prior-art, where

DETAILED DESCRIPTION OF PREFERRED EMBODYING EXAMPLE

Figure 1A:
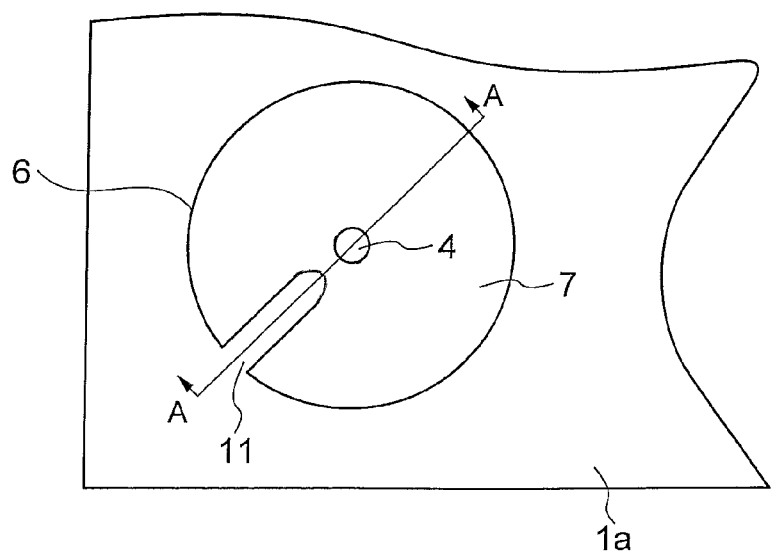
FIG. 1A is a partial enlarged plan view of a first substrate thereof.
Figure 1B:
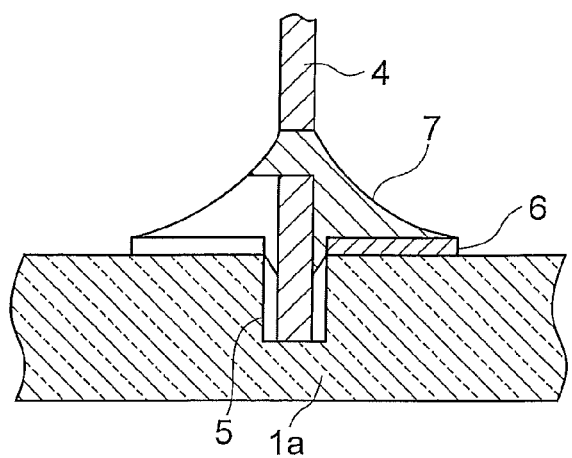
FIG. 1B is a partial enlarged section through a portion at which a metal pin 4 is erected in the first substrate.
Figure 1C:
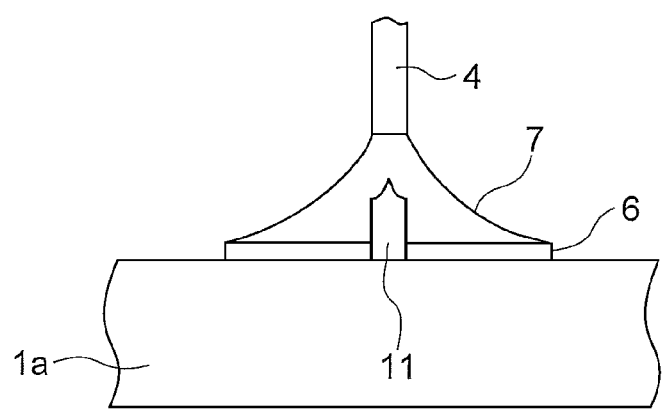
FIG. 1C is a side view as seen from an opened portion (cutaway portion) of the electrode land.
Figure 2A:
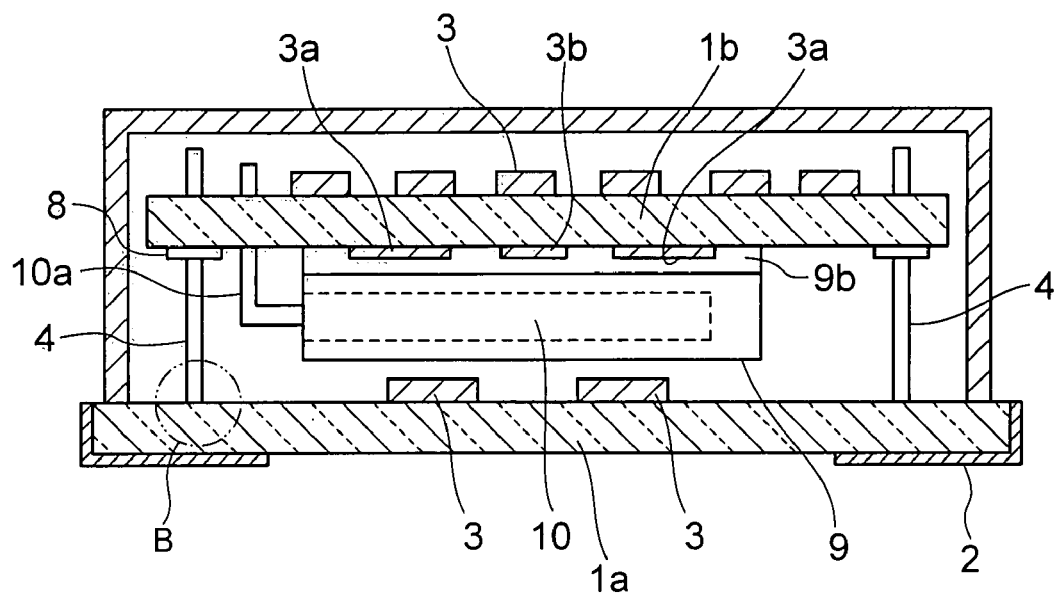
FIG. 2A is a section through the constant-temperature oscillator and FIG. 2B is a section through the disposition of the constant-temperature oven.
Figure 2B:
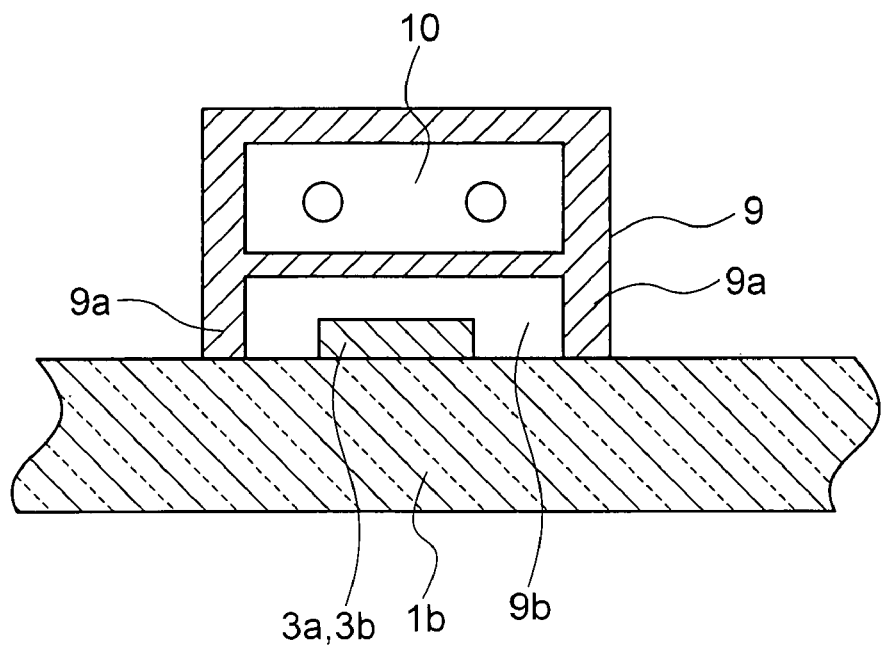
Figure 3A:
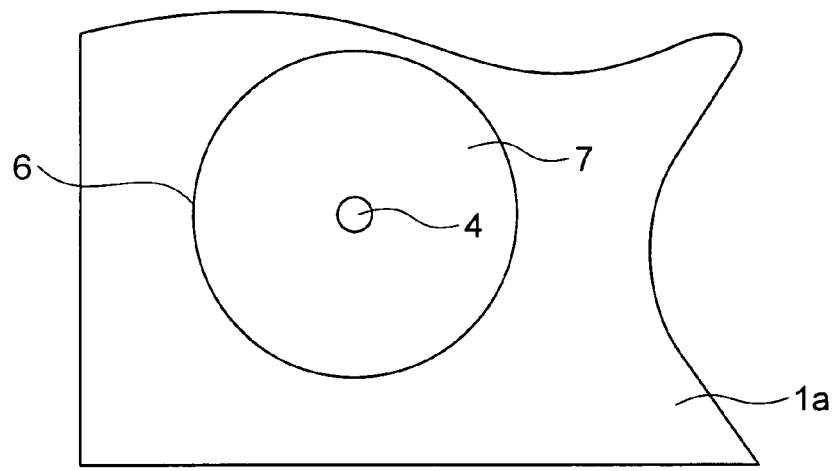
FIG. 3A is a partial enlarged plan view of a first substrate.
Figure 3B:
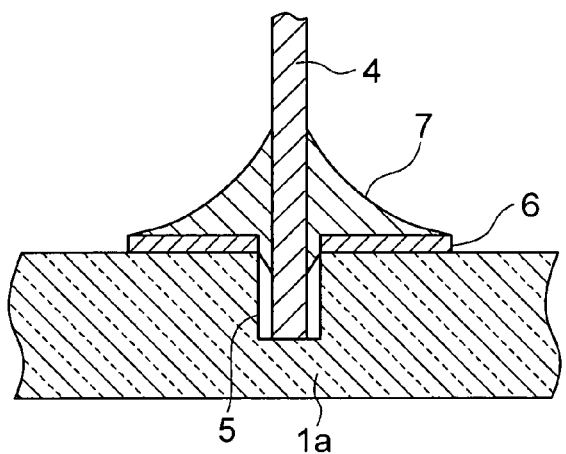
FIG. 3B is a partial enlarged section through a portion of the first substrate on which a metal pin is erected.
Figure 3C:
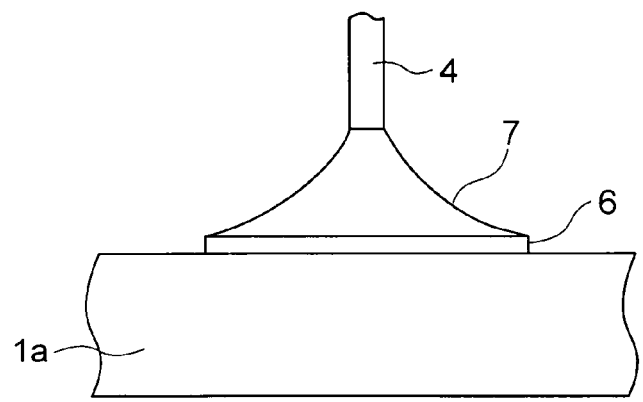
FIG. 3C is a side view thereof.

An embodiment of a two-level mounting board for a constant-temperature oscillator in accordance with the present invention is shown in FIG. 1, where FIG. 1A is a partial enlarged plan view of a portion of a first substrate at which a metal pin is erected, FIG. 1B is a partial enlarged section along the line A-A of FIG. 1A through the portion at which the metal pin is erected in the first substrate, and FIG. 1C is a side view as seen from an opened portion (cutaway portion) of the electrode land. Note that portions that are the same as those of the prior-art example are denoted by the same reference numbers, and further description thereof is either abbreviated or omitted.

The constant-temperature oscillator in accordance with the present invention is configured of a two-level mounting board in which the second substrate $1b$ is supported horizontally above the first substrate $1a$ by a plurality of the metal pins 4. In this case, the first substrate $1a$ is a stacked substrate having mounting terminals 2 on four corner portions of an outer base surface thereof, via the stacked surface and edge surfaces thereof, and circuit elements 3 are disposed on the surface thereof. The constant-temperature oven 9 in which is housed the crystal vibrator 10, the chip resistors $3a$ for heating, and the thermistor $3b$ for temperature detection are disposed on the lower surface of the second substrate $1b$, and circuit elements 3 for the oscillation circuit and temperature control are disposed on the upper surface thereof.

The bottomed holes 5 into which the lower ends of the corresponding metal pins 4 are to be inserted are formed by means such as drilling after the first substrate $1a$ has been assembled, by way of example. In this case, the electrode land 6 formed on the surface of the first substrate $1a$ around the outer periphery of the hole 5 has a cutaway portion 11 by which part of the ring thereof is opened. Part of the diameter of the hole 5 could be cut away, by way of example. This could be formed by first providing the hole 5 after the metal film has been formed on the first substrate $1a$, then cutting part of the electrode land 6.

The free end of the metal pin 4 at the lower side thereof is then inserted into the bottomed hole 5 formed in the first substrate $1a$ and is connected to the electrode land 6 by filling the area with the solder 7. This could be done by soldering and assembling the metal pins 4 into the four corner portions of the second substrate $1b$, then inserting the free, lower ends of the metal pins 4 into the corresponding holes 5 at the four corner portions of the first substrate $1a$.

Since this configuration ensures that part of the annular metal land is open (cut away), the base glass epoxy material that forms the substrate is exposed to form a non-electrode portion. Therefore, when the solder 7 melts, the solder 7 does not adhere to the base portion of the pin corresponding to this non-electrode portion, forming a connective portion that links the hole 5 spatially to the outer atmosphere. Thus the connective portion acts as an exhaust vent to release air to the outer atmosphere, even if air within the hole 5 expands when the solder 7 melts. Since this ensures that the soldering is not damaged by air that has expanded by the solder 7 itself, each metal pin 4 can be connected reliably to the first substrate $1a$.

In the above embodiment, the first substrate $1a$ and the second substrate $1b$ were described as being of a glass epoxy material, but other materials such as ceramics could be applied thereto in a similar manner. In addition, the crystal vibrator 10 was described as being a constant-temperature oscillator housed in the constant-temperature oven 9, but the present invention can also be applied to a configuration in which the crystal vibrator is not housed in the constant-temperature oven 9. Furthermore, the first substrate $1a$ was described as a stack of a plurality of substrates, but the present invention can of course be applied to a configuration with a single board.

What is claimed is:

1. A two-level mounting board in which a second substrate is supported horizontally by a metal pin above a first substrate having a mounting electrode on an outer base surface, wherein a free, lower end of said metal pin is inserted in a bottomed hole provided in the surface of said first substrate, wherein said metal pin is affixed by solder to an annular electrode land provided on the surface of said first substrate to form an outer periphery at least partially surrounding the pin, and wherein the annular electrode land includes a cut-away portion that forms a non-electrode connective portion fluidly linking the bottomed hole to the outer atmosphere and is configured to act as an exhaust vent to release air to the outer atmosphere even if air within the hole expands when the solder melts.

2. The two-level mounting board according to claim 1, wherein said second substrate is positioned on a stopper that protrudes as a disk provided at the upper end of said metal pin.

3. The two-level mounting board of claim 1, further comprising a crystal oscillator in which a crystal vibrator housed in a constant-temperature oven is provided on a lower surface of said second substrate, and wherein a circuit element is disposed on an upper surface of said second substrate.

* * * * *